US005598480A

United States Patent [19]

Kim

[11] Patent Number: 5,598,480

[45] Date of Patent: Jan. 28, 1997

[54] MULTIPLE OUTPUT TRANSFORMER NETWORK FOR SOUND REPRODUCING SYSTEM

[76] Inventor: Man H. Kim, 19422 Sturgess Dr., Torrance, Calif. 90503

[21] Appl. No.: 429,585

[22] Filed: Apr. 27, 1995

[30] Foreign Application Priority Data

Nov. 7, 1994 [KR] Rep. of Korea .................... 94-29454

[51] Int. Cl.[6] .................... H03G 5/00

[52] U.S. Cl. .................... 381/99; 381/77; 381/120

[58] Field of Search .................... 381/18, 99, 77, 381/120, 78; 330/195, 196

[56] References Cited

U.S. PATENT DOCUMENTS

| | | | |
|---|---|---|---|
| 3,697,692 | 10/1972 | Hafler | 381/18 |
| 4,237,340 | 12/1980 | Klipsch | 381/99 |
| 5,327,505 | 7/1994 | Kim | 381/99 |

*Primary Examiner*—Curtis Kuntz
*Assistant Examiner*—Vivian Chang

[57] ABSTRACT

A multiple output transformer network for a high-fidelity sound reproducing system which includes a high-frequency speaker and a low-frequency speaker, first and second audio output autotransformers, a high-frequency bandpass filter coupling the first autotransformer to the high-frequency speaker, and a low-frequency bandpass filter coupling the second autotransformer to the second speaker, all of the foregoing components being mounted in a remote speaker unit. The winding of the first autotransformer is connected to the output amplifier of the sound reproducing equipment by a first extension lead, and to ground; and the winding of the second autotransformer is connected to the output amplifier of the sound reproducing equipment by a second extension lead and to ground; and the high-frequency and low-frequency bandpass filters are respectively connected to center taps on the windings of the first and second autotransformers.

2 Claims, 2 Drawing Sheets

MULTIPLE OUTPUT TRANSFORMER NETWORK FOR SOUND REPRODUCING SYSTEM

BACKGROUND OF THE INVENTION

Related patent application Serial No. 94-29454, Korea, filed Nov. 7, 1994.

The present invention relates to high-fidelity sound reproducing systems and, more particularly, to systems of the type described in U.S. Pat. 5,327,505 which issued Jul. 5, 1994 in the name of the present inventor. In the systems described in the patent, the output transformers of a sound reproducing unit are mounted in a speaker module which is located at a position remote from the output amplifier of the sound reproducing unit.

As pointed out in the patent, it is usual in high-fidelity sound reproducing systems to use two or more speakers which cover complementary frequency ranges. Specifically, in two-speaker systems, a high-frequency speaker (tweeter or driver) and a low-frequency speaker (woofer) are provided with appropriate high-frequency and low-frequency bandpass filters with predetermined crossover characteristics. The systems are constructed so that audio output signals in the high-frequency portion of the frequency range are directed predominantly to the high-frequency speaker and audio output signals in the mid and low-frequency portion of the frequency range are directed predominantly to the low-frequency speaker.

In the prior art systems, the output from the output audio power amplifier of the sound reproducing equipment is supplied to a passive crossover network which separates the high and low frequencies, thereby supplying the mid and low frequencies to the woofer and the high frequencies to the tweeter or driver.

To achieve realism in sound reproduction systems fundamental conditions must be satisfied, namely: the frequency range must include without frequency discrimination all audible components of the various sounds to be reproduced; the volume range must permit noiseless and distortionless reproduction of the entire range of intensity associated with the sounds; and the reverberation characteristics of the original sound must be approximated in the reproduced sound.

It has been found difficult in the prior art sound reproducing systems to fulfill some of the fundamental conditions listed above without resorting to relatively complex and expensive circuitry, especially in cases where the speakers are located at a position remote from the output power amplifier of the sound reproducing equipment.

Such difficulties are overcome in the systems described in the patent by locating the output transformers and the high-frequency/low-frequency bandpass filters in a remote speaker unit displaced from the output audio power amplifier of the sound reproducing equipment, and then by connecting the audio power amplifier to the primary windings of the output transformers by appropriate electrical extension leads.

In systems described in the U.S. Pat. No. 5,327,505 referred to above there are no appreciable energy losses or changes in frequency characteristics due to the extension leads. The system of the patent also assures the complete separation of high and low-frequency signals from the output amplifier. This is because the separated signals are delivered directly to the speakers.

The systems of the patent also provides for the availability of completely independent volume controls for each speaker and assures distinct crossover characteristics for high and low-frequency components, and also for mid-frequency components if so desired.

For example, by overlapping frequencies independently, such as 20 Hz to 5,000 Hz for the low-frequency speaker, and 150 Hz to 20,000 Hz for the high-frequency speaker, faithful reproduction may be achieved, for solo performances of piano, violin and cello, for example, as well as for tenor and soprano singers.

Also, the systems of the patent preclude distortions in the mid-frequency range when the low-frequency filter is set, for example, to a range of 500 Hz to 4,000 Hz, with independent high-frequency separation for choruses, symphony orchestras, heavy metal music, etc. Specifically, the systems of the patent permit the control of crossover, and independent control of volume in each frequency range so as to adapt the reproduction characteristics of the systems to the sounds being reproduced.

In addition, overall efficiency is increased materially by the systems of the patent because separation of the frequency ranges occurs at the remote speaker unit rather than at the output amplifier. The overall result is that sound is reproduced by the speakers at a selected decibel level with less energy being required as compared with present-day systems.

The system of the present invention is of the same general type as the systems described in the patent. However, in the present system the multiple winding output transformers used in the systems described in the patent are replaced by autotransformers. This constitutes a distinct improvement in the quality of the audio signals delivered to the speakers. This is because the output transformers with separate primary and secondary windings produce distortions in the audio signals due to inductive changes in the multiple winding transformers as a function of frequency. Also, the autotransformers used in the system of the present invention are advantageous over the multiple winding transformers used in the systems of the patent because of the excessive wire requirements of the multiple winding transformers as compared with the autotransformers of the system of the present invention.

DETAILED DESCRIPTION OF THE ILLUSTRATED EMBODIMENT

Figure 1:
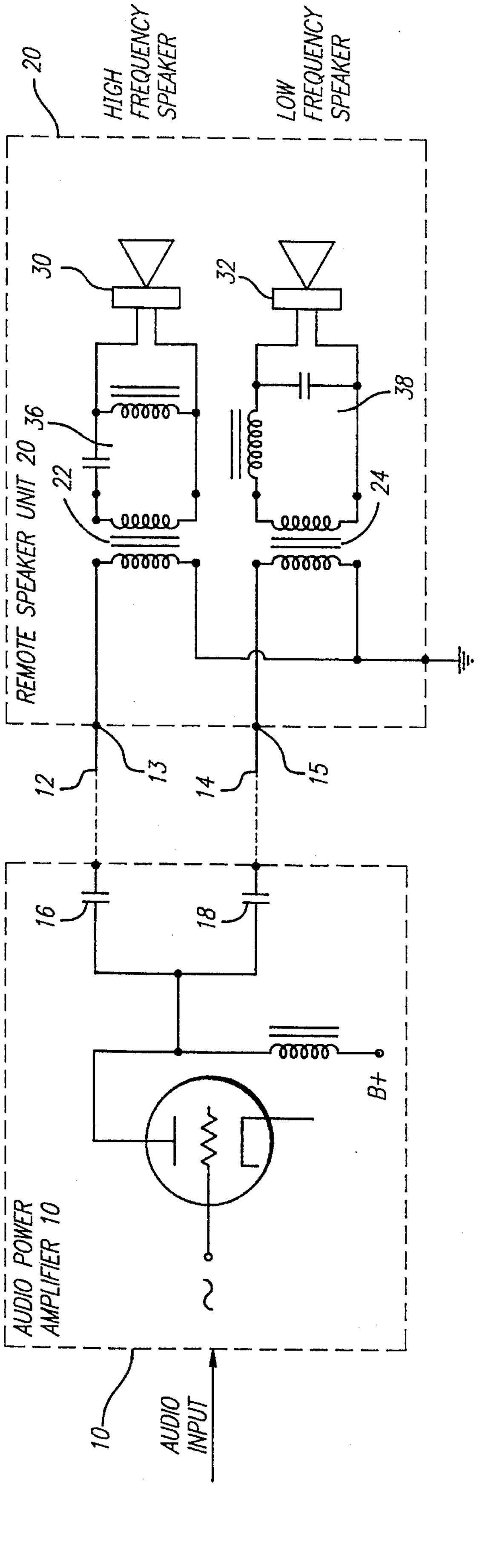
FIG. 1 PRIOR ART
FIG. 1 is a schematic diagram, illustrating in circuit detail one of the systems disclosed in U.S. Pat. No. 5,327,505 which includes a remote speaker unit having multiple winding output transformers.

In the prior art system of FIG. 1, the output audio power amplifier of a typical sound reproducing unit is designated 10. The output of power amplifier 10 is coupled to a pair of extension leads 12 and 14 by means of respective capacitors 16 and 18. The extension leads 12 and 14 are connected to the input terminals 13 and 15 of a remote speaker unit 20. The input terminals 13 and 15 are connected respectively to one of the terminal of each of the primary windings of a pair of output transformers 22 and 24, the other terminals of the primary windings being grounded.

In the prior art system of FIG. 1, the output transformers 22 and 24, instead of being incorporated into audio power output amplifier 10 in the sound reproducing unit, are located in the remote speaker unit 20. The secondary windings of the output transformers 22 and 24 are coupled respectively to a high-frequency speaker (tweeter or driver) 30 and a low-frequency speaker (woofer) 32 through a high-pass filter network 36 and low-pass filter network 38, as shown.

In the prior art system of FIG. 1, the extension leads 12 and 14 serve to connect the remote speaker unit 20 to the power amplifier 10 without any significant energy losses or changes in frequency characteristics which are inherent in the prior art systems in which the output transformers are located in the power amplifier of the sound reproducing equipment, as are the high-pass and low-pass filter networks 36 and 38. The system of FIG. 1 also assures complete separation of the high and low-frequency signals from the output amplifier as the separated signals are delivered directly to the speakers 30, 32.

Figure 2:
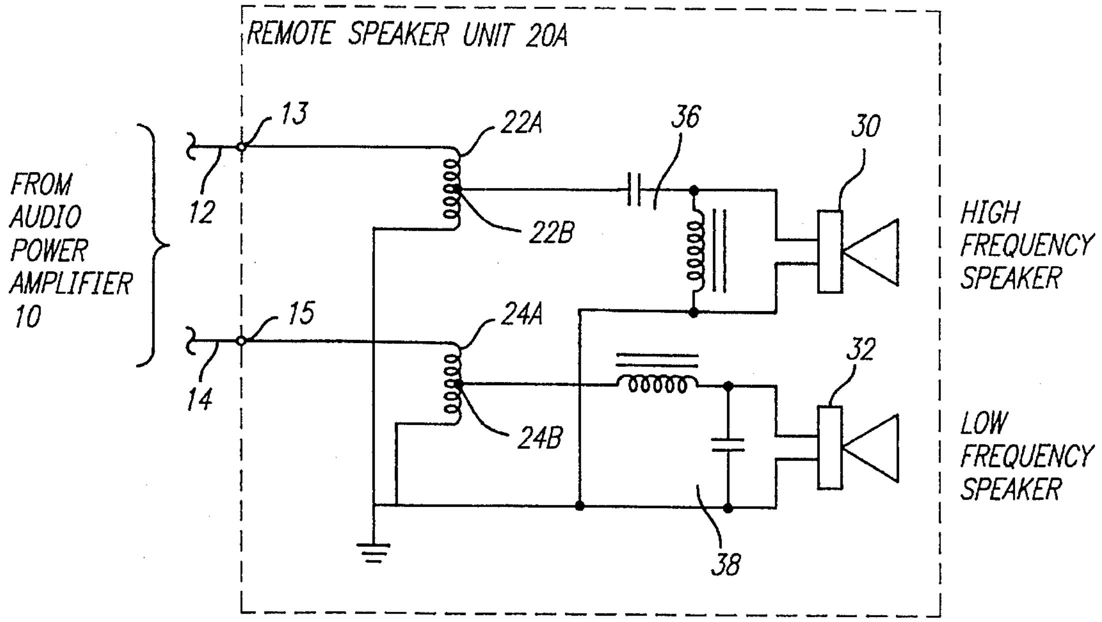
FIG. 2 is a schematic diagram, illustrating in circuit detail the output speaker transformer network of the present invention which uses autotransformers.

In the system of the present invention, as shown in FIG. 2, the remote speaker unit 20 of the prior art system of FIG. 1 is replaced by a remote speaker unit designated 20A. All of the components of the circuit of FIG. 2 which find counterparts in the circuit of FIG. 1 are designated by the same numbers.

In the circuit of FIG. 2, the multiple winding transformers 22 and 24 of FIG. 1 are replaced by autotransformers 22A and 24A. The multiple winding transformers 22 and 24 of FIG. 1, and the autotransformers 22A and 24A of FIG. 2, are audio transformers which are used to transfer complex audio signals containing energy at a large number of frequencies from the audio power amplifier 10 to the circuitry associated with the speakers 30 and 32. In high fidelity systems, audio transformers are required to respond uniformly to signal voltages over a frequency three to five or more decades wide (for example, from 10 to 100,000 Hz), and consequently it is essential that very nearly all of the magnetic flux threading through one coil of the transformer also passes through the other. The autotransformer achieves this desired result better than the multiple winding transformer and more economically.

The autotransformer is a special form of transformer having a single winding, a first portion of which is common to both the primary and secondary circuits, and a second portion which is in series with the common portion. The current in the high-voltage primary circuit flows through the series and common portions. The current in the low-voltage secondary circuit flows only through the common winding and adds vectorially to the current in the high-voltage primary circuit. Thus, an electrical connection exists between the high-voltage and low-voltage windings. Because of this sharing of parts of the winding, an autotransformer having the same kilovolt-ampere (kVA) output rating is generally smaller in weight and dimensions than the corresponding two-winding transformer and is lower in cost.

The equivalent size of a two-winding transformer is given by the coratio times the output kVA, where the coratio equals (HV–LV)/HV. When the coratio is small, that is, when the high-voltage and low-voltage magnitudes are close together, the cost advantage in favor of the autotransformer over the two-winding transformer is large.

In the embodiment of the invention shown in FIG. 2, tap 22B on transformer 22A and tap 24B on transformer 24A are essentially center taps so that the high-voltage and low-voltage magnitudes are relatively close to one another and the aforementioned cost advantage is achieved. The center tap 22B is connected to the filter 36 associated with the high-frequency speaker 30, and the tap 24B is connected to the filter 38 associated with the low-frequency speaker. The transformers 22A and 24A are connected to ground, as are the filters 36 and 38, as shown in FIG. 2.

The coratio of the autotransformer is the ratio $C_{IN}/C_{OUT}$, where $C_{IN}$ is the capacity of the transformer across the entire series and common windings and $C_{OUT}$ is the capacity across the common winding. As stated above:

$$\frac{C_\epsilon}{C_{OUT}} = \frac{HV - LV}{HV} = 1 - \frac{LV}{HV} \qquad (1)$$

Where: HV is the voltage across both the series and common windings, and LV is the voltage across the series winding.

Figure 3:
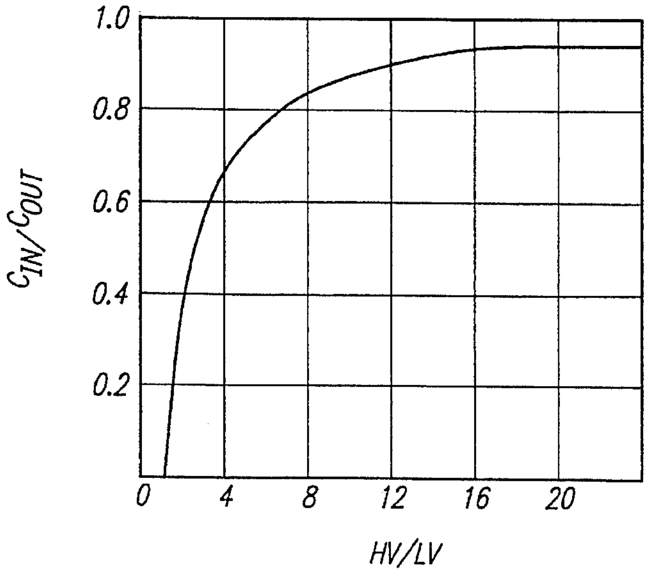
FIG. 3 is the characteristic curve for the autotransformers used in the transformer network of FIG. 2.

As shown in the characteristic curve of FIG. 3, if the voltage ratio HV/LV is greater than 10, the coratio is substantially constant as the ratio HV/LV increases, and it approaches 1. However, if HV/LV is essentially 1, as is the case in the circuit of FIG. 2, the coratio drops significantly, as shown in FIG. 3, and the autotransformer operates with uniform response over the audio frequency band and is economical to construct since it has the features of reduced wiring when the voltage ratio of the primary and secondary windings approaches 1. The autotransformer also has good voltage variation rate and high efficiency as compared with the two-winding transformer with respect to output capacity since the filtered current is the transformer capacity.

The voltage-variation rate of the autotransformer is better than that of the conventional two-winding transformer. According to the relation (HV–LV)/LV=1–1/a or 1/(a–1), the short circuit current is eleven times greater than the two-winding transformer and a clear difference between the frequencies can be obtained. As mentioned above, the use of the autotransformer reduces the wiring length in the amount of the HV/LV ratio and thus the production cost. Efficiency is also improved because of the reduction of the wiring length which is proportional to capacity. It is also easy to cool the circuit because of the small increase in temperature in the autotransformers. Also, since HV/LV is nearly 1, the load capacity is large compared with the equivalent capacity. In general, the autotransformers used in the circuit of the present invention have the advantages of being economical and of improving the voltage-variation rate and the efficiency of the overall network.

It will be appreciated that while a particular embodiment of the invention has been shown and described, modifications may be made. It is intended in the following claims to cover all such modifications which fall within the true spirit and scope of the invention.

I claim:

1. In sound reproducing equipment, the combination of: an audio output power amplifier and a remote speaker unit coupled to the audio output power amplifier by first and second extension leads; said remote speaker unit including first and second speakers, first and second autotransformers connected to the audio output power amplifier by the first and second extension leads respectively, a first bandpass filter coupling the first autotransformer to the first speaker, and a second bandpass filter coupling the second autotransformer to the second speaker, said first and second speakers being respectively high-frequency and low-frequency speakers, and said first and second bandpass filters being respectively high-frequency bandpass and low-frequency bandpass filters having predetermined cross-over characteristics, said first autotransformer comprising a winding having one side connected to the first extension lead and a second side connected to ground and having a tap on said winding connected to said high-frequency filter, and said second autotransformer comprising a winding having one side connected to the second extension lead and a second side connected to ground and having a tap connected to said low-frequency filter.

2. The combination defined in claim 1, in which the taps on the windings of the first and second autotransformers are located at the center of the respective windings.

* * * * *